United States Patent
Li et al.

(10) Patent No.: US 11,245,359 B2
(45) Date of Patent: Feb. 8, 2022

(54) QUADRATURE VOLTAGE-CONTROLLED OSCILLATOR CIRCUIT WITH PHASE SHIFT

(71) Applicant: SOUTH CHINA UNIVERSITY OF TECHNOLOGY, Guangdong (CN)

(72) Inventors: Chao Li, Guangdong (CN); Quan Xue, Guangdong (CN); Liang Wu, Guangdong (CN); Shaowei Liao, Guangdong (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/138,916

(22) Filed: Dec. 31, 2020

(65) Prior Publication Data
US 2021/0119578 A1    Apr. 22, 2021

Related U.S. Application Data

(63) Continuation of application No. PCT/CN2019/113796, filed on Oct. 28, 2019.

(30) Foreign Application Priority Data

Dec. 15, 2018   (CN) .......................... 201811537853.3
Dec. 29, 2018   (CN) .......................... 201811641561.4

(51) Int. Cl.
*H03B 5/12*      (2006.01)
*H03B 27/00*     (2006.01)

(52) U.S. Cl.
CPC ......... *H03B 5/1215* (2013.01); *H03B 5/1228* (2013.01); *H03B 5/1253* (2013.01);
(Continued)

(58) Field of Classification Search
CPC .. H03B 5/1212; H03B 5/1215; H03B 5/1228; H03B 5/1231; H03B 5/1237;
(Continued)

(56) References Cited

U.S. PATENT DOCUMENTS 9,484,858 B1   11/2016   Kalia et al.
2004/0251975 A1*  12/2004   Li .................... H03B 5/1271
                                                 331/46
(Continued)

FOREIGN PATENT DOCUMENTS

CN    102355258    2/2012
CN    103762945    4/2014
(Continued)

OTHER PUBLICATIONS

Huang, De-Ping et al., "An Optimally Coupled Low Phase Noise Wideband Quadrature Voltage-Controlled Oscillator", Journal of Fudan University (Natural Science), vol. 49, No. 2, Apr. 15, 2010, submit with English abstract, pp. 249-256.

*Primary Examiner* — Levi Gannon
(74) *Attorney, Agent, or Firm* — JCIPRNET (57) ABSTRACT

A quadrature voltage-controlled oscillator circuit with phase shift includes two voltage-controlled oscillators with the same structure, wherein the two voltage-controlled oscillators are connected to each other through input and output ports, and the two voltage-controlled oscillators respectively include a cross-coupled oscillating circuit, an injection locking circuit, a resonant circuit and a voltage-controlled current source circuit which are electrically connected to each other; and signals are injected through the injection locking circuit and coupled with the oscillating circuit, so as to output a quadrature signal. An oscillator is enabled to operate stably in one mode by means of a simple circuit structure, and a good phase shift can be provided for the
(Continued)

resonant circuit in a lower frequency band; and meanwhile, a tuning range of the oscillator is improved without increasing phase noise.

5 Claims, 5 Drawing Sheets

(52) U.S. Cl.
CPC ........... *H03B 5/1271* (2013.01); *H03B 27/00* (2013.01); *H03B 2200/0074* (2013.01); *H03B 2200/0078* (2013.01)

(58) Field of Classification Search
CPC .... H03B 5/124; H03B 5/1243; H03B 5/1246; H03B 5/125; H03B 5/1253; H03B 5/1271; H03B 27/00; H03B 2200/0074; H03B 2200/0078
See application file for complete search history.

(56) References Cited

U.S. PATENT DOCUMENTS

| | | | | |
|---|---|---|---|---|
| 2010/0219896 A1* | 9/2010 | Sanduleanu | ........... | H03B 27/00 331/117 R |
| 2012/0249250 A1* | 10/2012 | Cheng | .................. | H03B 5/1243 331/45 |

FOREIGN PATENT DOCUMENTS

| | | |
|---|---|---|
| CN | 106712719 | 5/2017 |
| CN | 109525198 | 3/2019 |

* cited by examiner

QUADRATURE VOLTAGE-CONTROLLED OSCILLATOR CIRCUIT WITH PHASE SHIFT

CROSS-REFERENCE TO RELATED APPLICATION

The present application is a continuation of international application of PCT application serial no. PCT/CN2019/113796, filed on Oct. 28, 2019, which claims the priority benefit of China application no. 201811641561.4, filed on Dec. 29, 2018 and China application no. 201811537853.3, filed on Dec. 15, 2018. The entirety of each of the above-mentioned patent applications is incorporated herein by reference and made a part of this specification.

TECHNICAL FIELD

The present invention relates to the field of quadrature voltage-controlled oscillators, and more particularly, to a quadrature voltage-controlled oscillator circuit with phase shift.

BACKGROUND

In a modern wireless receiving and transmitting device, up-conversion and down-conversion mixing on quadrature oscillating signals are required. Usually, in order to generate the quadrature signal, one of the most popular methods is to generate the quadrature signal by an injection locking LC cross-coupled structure. Meanwhile, in order to prevent a varactor in a resonant circuit from lowering a quality factor, a plurality of frequency adjustment technologies without the varactor are derived. However, since an injection direction of a signal is uncertain, two operating modes may be introduced into a traditional injection locking quadrature oscillator, which exist symmetrically, and have the same corresponding impedance value. It is uncertain which of the two modes the oscillator will oscillate in, so that an accurate operating frequency is unpredictable. Therefore, it is necessary to provide a quadrature voltage-controlled oscillator circuit with phase shift to solve the above defects in the prior art.

SUMMARY

In view of this, in order to solve the above problems in the prior art, a phase shift needs to be introduced into an oscillator circuit. The present invention provides a quadrature voltage-controlled oscillator circuit with phase shift. An oscillator is enabled to operate stably in one mode by means of a simple circuit structure, and a good phase shift can be provided for a resonant circuit in a lower frequency band. Meanwhile, a tuning range of the oscillator is improved without increasing phase noise.

In order to achieve the above objective, the technical solutions of the present invention are as follows.

A quadrature voltage-controlled oscillator circuit with phase shift includes a first voltage-controlled oscillator and a second voltage-controlled oscillator with a same structure, the first voltage-controlled oscillator and the second voltage-controlled oscillator are connected to each other through input and output ports, wherein the first voltage-controlled oscillator includes a first cross-coupled oscillating circuit, a first injection locking circuit, a first resonant circuit and a first voltage-controlled current source circuit which are electrically connected to each other, the first cross-coupled oscillating circuit is composed of four transistors, wherein a gate of a first transistor and a gate of a third transistor are jointly connected to a bias voltage, a drain of the first transistor is connected to a gate of a fourth transistor through a first node, a drain of the third transistor is connected to a gate of a second transistor through a second node, and a source of the second transistor is connected to a source of the fourth transistor through a third node.

A source of the first transistor and a drain of the second transistor are connected to each other to form a cascode structure, and a source of the third transistor and a drain of the fourth transistor are connected to each other to form a cascode structure by means of the above circuit structure. In this way, phase shift can be provided in the first cross-coupled oscillating circuit, and an oscillator is enabled to operate stably in one mode by means of a simple circuit structure.

Further, the first injection locking circuit is composed of four transistors, a gate of a fifth transistor and a gate of a seventh transistor are jointly connected to the bias voltage, a drain of the fifth transistor is connected to the first node, a drain of the seventh transistor is connected to the second node, a source of a sixth transistor is connected to a source of an eighth transistor through a fourth node, a gate of the sixth transistor is connected to a positive quadrature input port, and a gate of the eighth transistor is connected to a negative quadrature input port.

A source of the fifth transistor and a drain of the sixth transistor are connected to each other to form a cascode structure, and a source of the seventh transistor and a drain of the eighth transistor are connected to each other to form a cascode structure by means of the above circuit structure. In this way, the cascode structure is provided in the first injection locking circuit.

Phase shift is performed on an oscillation signal and an injection signal at the same time by adding the cascode structure in the first cross-coupled oscillating circuit and the first injection locking circuit, so that an output signal synthesized by the oscillation signal and the injection signal produces a good phase shift, thus generating a larger tuning range. Therefore, the quadrature voltage-controlled oscillator circuit according to the present invention can realize that the quadrature voltage-controlled oscillator circuit itself has phase shift, without additionally introducing a complicated phase shift circuit. In this way, a circuit structure is simple, a complexity of the circuit is not increased while providing the phase shift, and an occupied area of the circuit is greatly reduced without occupying a large amount of area in an integrated chip.

Further, the first resonant circuit further includes a first center tap inductor, two ends of the first center tap inductor are respectively connected to the first node and the second node, and a center tap is connected to a supply voltage.

Further, the first voltage-controlled current source circuit includes a first cross-coupled current source and a first injection locking current source, wherein a drain of a ninth transistor is connected to the third node, a source of the ninth transistor is grounded, and a gate of the ninth transistor is connected to a first control voltage to form the first cross-coupled current source; and a drain of a tenth transistor is connected to the fourth node, a source of the tenth transistor is grounded, and a gate of the tenth transistor is connected to a second control voltage to form the first injection locking current source.

Further, the second voltage-controlled oscillator includes a second cross-coupled oscillating circuit, a second injection locking circuit, a second resonant circuit and a second voltage-controlled current source circuit which are electrically connected to each other, and has a structure same as the first voltage-controlled oscillator, and in the second injection locking circuit, a gate of a sixteenth transistor is connected to a positive in-phase input port, and a gate of an eighteenth transistor is connected to a negative in-phase input port.

Further, the first node of the first voltage-controlled oscillator is connected to a negative in-phase output port, and the first negative in-phase output port is connected to a negative in-phase input port of the second voltage-controlled oscillator; the second node of the first voltage-controlled oscillator is connected to a positive in-phase output port, and the first positive in-phase output port is connected to a positive in-phase input port of the second voltage-controlled oscillator; a fifth node of the second voltage-controlled oscillator is connected to a positive quadrature output port, and the second positive quadrature output port is connected to a positive quadrature input port of the first voltage-controlled oscillator; and a sixth node of the second voltage-controlled oscillator is connected to a negative quadrature output port, and the negative quadrature output port is connected to a negative quadrature input port of the first voltage-controlled oscillator.

Compared with the prior art, the quadrature voltage-controlled oscillator circuit with the phase shift of the present invention has the following beneficial effects and advantages:

(1) the circuit realizes that itself has phase shift, and the oscillator is enabled to operate stably in one mode by means of the simple circuit structure;

(2) the circuit can provide at least five times of phase shift for the resonant circuit in a lower frequency band (10 GHz to 40 GHz), and the increasing times are increased with increase of the frequency; and (3) compared with a traditional injection locking oscillator, the tuning range of the oscillator is increased in the circuit without increasing the phase noise.

DETAILED DESCRIPTION

The specific implementation of the present invention is further described hereinafter with reference to the accompanying drawings and the specific embodiments. It should be pointed out that the described embodiments are only some but not all of the embodiments of the present invention, and based on the embodiments of the present invention, other embodiments obtained by those of ordinary skills in the art without going through any creative work all belong to the scope of protection of the present invention.

Figure 1:
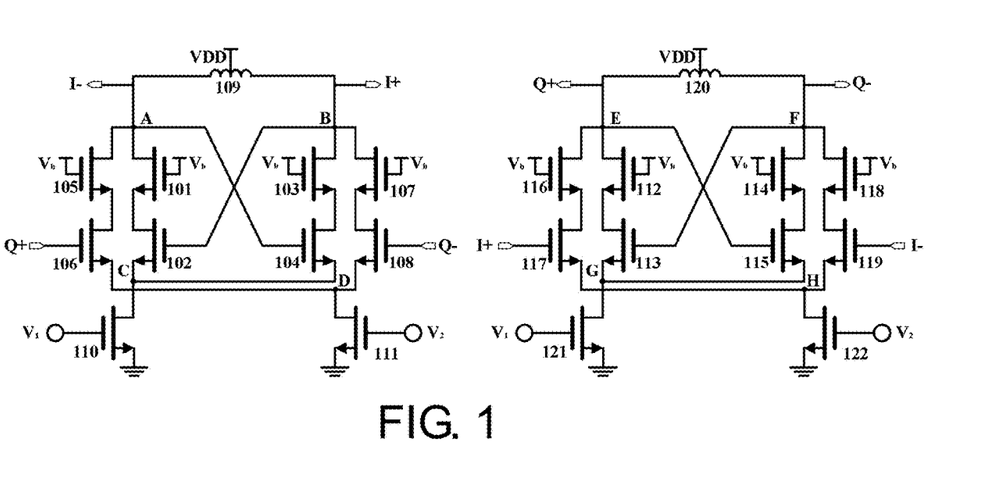
FIG. 1 is a principle diagram of a quadrature voltage-controlled oscillator circuit with phase shift of the present invention.

As shown in FIG. 1, a quadrature voltage-controlled oscillator circuit with phase shift includes a first voltage-controlled oscillator and a second voltage-controlled oscillator with a same structure, and the first voltage-controlled oscillator and the second voltage-controlled oscillator are connected to each other through input and output ports. The first voltage-controlled oscillator includes a first cross-coupled oscillating circuit, a first injection locking circuit, a first resonant circuit and a first voltage-controlled current source circuit which are electrically connected to each other, and signals are injected through the injection locking circuit and coupled with the oscillator circuit, thus outputting a quadrature signal.

The first cross-coupled oscillating circuit is composed of four transistors. A gate of a first transistor 101 and a gate of a third transistor 103 are jointly connected to a bias voltage $V_b$, a drain of the first transistor 101 is connected to a gate of a fourth transistor 104 through a first node A, a drain of the third transistor 103 is connected to a gate of a second transistor 102 through a second node B, and a source of the second transistor 102 is connected to a source of the fourth transistor 104 through a third node C.

Preferably, the first injection locking circuit is composed of four transistors. A gate of a fifth transistor 105 and a gate of a seventh transistor 107 are jointly connected to the bias voltage $V_b$, a drain of the fifth transistor 105 is connected to the first node A, a drain of the seventh transistor 107 is connected to the second node B, a source of a sixth transistor 106 is connected to a source of an eighth transistor 108 through a fourth node D, a gate of the sixth transistor 106 is connected to a positive quadrature input port, and a gate of the eighth transistor 108 is connected to a negative quadrature input port.

Preferably, the first resonant circuit further includes a first center tap inductor 109, two ends of the first center tap inductor 109 are respectively connected to the first node A and the second node B, and a center tap is connected to a supply voltage.

Preferably, the first voltage-controlled current source circuit is composed of a first cross-coupled current source and a first injection locking current source. A drain of a ninth transistor 110 is connected to the third node C, a source of the ninth transistor 110 is grounded, and a gate of the ninth transistor 110 is connected to a first control voltage $V_1$ to form the first cross-coupled current source. A drain of a tenth transistor 111 is connected to the fourth node D, a source of the tenth transistor 111 is grounded, and a gate of the tenth transistor 111 is connected to a second control voltage $V_2$ to form the first injection locking current source. The first voltage-controlled current source circuit may adjust an amplitude and a phase of the injection signal and an amplitude and a phase the oscillation signal by adjusting a magnitude of the control voltage, so that the oscillator has a relatively wide tuning range. Meanwhile, a placement position of the first voltage-controlled current source circuit may be realized in various forms, for example, a structure of upper end current bias is used.

Preferably, the second voltage-controlled oscillator includes a second cross-coupled oscillating circuit, a second injection locking circuit, a second resonant circuit and a second voltage-controlled current source circuit which are electrically connected to each other, and the second cross-coupled oscillating circuit is composed of four transistors. A source of an eleventh transistor 112 and a drain of a twelfth transistor 113 are connected to each other to form a cascode structure, and a source of a thirteenth transistor 114 and a drain of a fourteenth transistor 115 are connected to each other to form a cascode structure. A gate of the eleventh transistor 112 and a gate of the thirteenth transistor 114 are jointly connected to a bias voltage $V_b$, a drain of the eleventh transistor 112 is connected to a gate of the fourteenth transistor 115 through a fifth node E, a drain of the thirteenth transistor 114 is connected to a gate of the twelfth transistor 113 through a sixth node F, and a source of the twelfth transistor 113 is connected to a source of the fourteenth transistor 115 through a seventh node G.

Preferably, the second injection locking circuit is composed of four transistors. A source of a fifteenth transistor 116 and a drain of a sixteenth transistor 117 are connected to each other to form a cascode structure, and a source of a seventeenth transistor 118 and a drain of an eighteenth transistor 119 are connected to each other to form a cascode structure. A gate of the fifteenth transistor 116 and a gate of the seventeenth transistor 118 are jointly connected to the bias voltage $V_b$, a drain of the fifteenth transistor 116 is connected to the node E, and a drain of the seventeenth transistor 118 is connected to the node F. A source of the sixteenth transistor 117 is connected to a source of the eighteenth transistor 119 through a node H, a gate of the sixteenth transistor 117 is connected to a positive in-phase input port, and a gate of the eighteenth transistor 119 is connected to a negative in-phase input port.

Preferably, the second resonant circuit further includes a second center tap inductor 120, two ends of the second center tap inductor 120 are respectively connected to the fifth node E and the sixth node F, and a center tap is connected to a supply voltage.

Preferably, the second voltage-controlled current source circuit is composed of a second cross-coupled current source and a second injection locking current source. A drain of a ninth transistor 121 is connected to the seventh node G, a source of the ninth transistor 121 is grounded, and a gate of the ninth transistor 121 is connected to the control voltage $V_1$ to form the second cross-coupled current source. A drain of a twentieth transistor 122 is connected to the eighth node H, a source of the twentieth transistor 122 is grounded, and a gate of the twentieth transistor 122 is connected to the control voltage $V_2$ to form the second injection locking current source.

Preferably, the first node A of the first voltage-controlled oscillator is connected to a negative in-phase output port, and the first negative in-phase output port is connected to a negative in-phase input port of the second voltage-controlled oscillator. The second node B of the first voltage-controlled oscillator is connected to a positive in-phase output port, and the first positive in-phase output port is connected to a positive in-phase input port of the second voltage-controlled oscillator. The fifth node E of the second voltage-controlled oscillator is connected to a positive quadrature output port, and the second positive quadrature output port is connected to a positive quadrature input port of the first voltage-controlled oscillator. The sixth node F of the second voltage-controlled oscillator is connected to a negative quadrature output port, and the negative quadrature output port is connected to a negative quadrature input port of the first voltage-controlled oscillator.

A principle of the injection locking quadrature voltage-controlled oscillator circuit is that: in the first voltage-controlled oscillator, two pairs of cascode transistors in the first oscillating circuit generate the oscillation signal, and the first injection locking circuit with the cascode transistors injects the signal outputted from the second voltage-controlled oscillator into the first oscillating circuit. The oscillation signal and the injection signal are subjected to vector superposition, and then injected into the second injection locking circuit of the second voltage-controlled oscillator through an in-phase output port. The injection signal of the second locking circuit and the signal generated by the second oscillating circuit are subjected to vector superposition in the same way, and then injected into the first voltage-controlled oscillator through a quadrature output port. When an equivalent transconductance $G_{m1}$ generated by the first oscillating circuit and an equivalent transconductance $G_{m1}$ generated by the second oscillating circuit meet $G_{m1}=-G_{m2}$, the signal generated from the output port can meet $V_{1+}=-V_{1-}+jV_{Q+}=-jV_{Q-}$, and four quadrature signals with a difference of 90° between every two signals are generated at four output ports. Further, magnitudes of the oscillation signal and the injection signal may be changed by changing the control voltages $V_1$ and $V_2$ of the first voltage-controlled current source circuit and the second voltage-controlled current source circuit at the same time, and then the phase shift of the signals subjected to the vector superposition is changed, thus realizing a tuning function.

Figure 2:
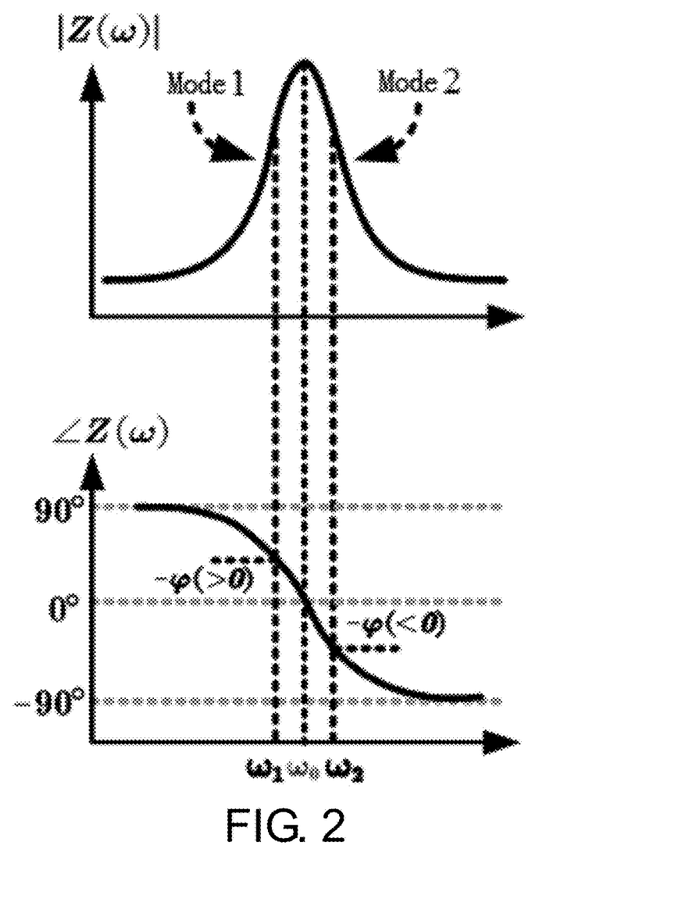
FIG. 2 is a mode pattern of a traditional quadrature voltage-controlled oscillator circuit.

In a traditional quadrature voltage-controlled oscillator circuit, since the injection signal may lead or lag behind the oscillation signal, a phase of the output signal synthesized by the two signals may have two unknown shifts ±φ, resulting in a final output frequency of $\omega_1$ or $\omega_2$, which are corresponding to a mode 1 and a mode 2 in FIG. 2. The two modes are unpredictable in practical application.

Therefore, based on a traditional circuit structure, a phase shift circuit is added between the output signal of the oscillating circuit of the oscillator and the output signal of the injection locking circuit. The phase shift circuit may be formed by cascading two transistors which form the cascode structure. Replacement of a single transistor in the traditional circuit with this structure can not only replace an original function, but also provide a stable phase shift.

Figure 3:
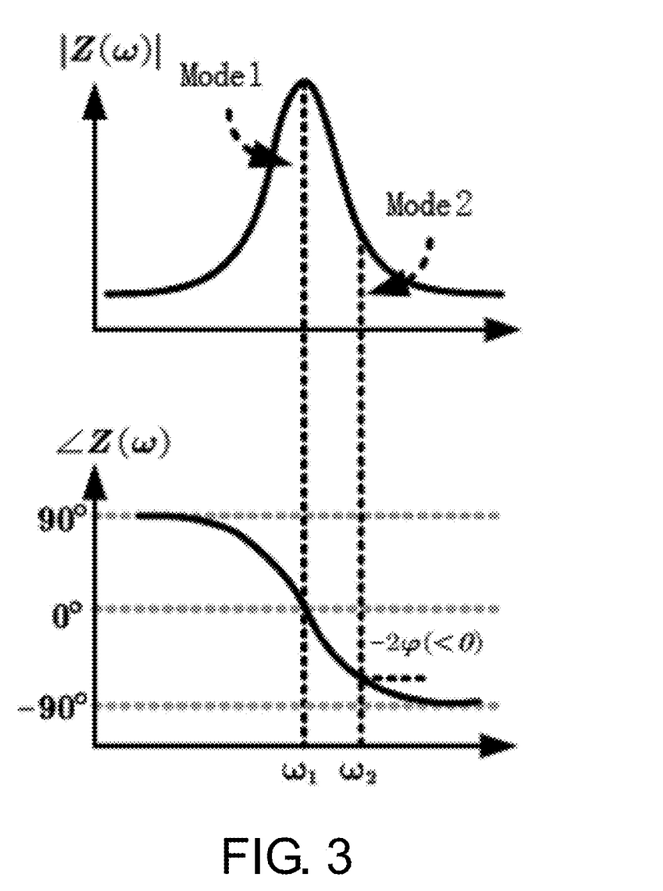
FIG. 3 is a mode pattern of the quadrature voltage-controlled oscillator circuit of the present invention.

The cascode structure is formed by cascading two transistors, which may convert a voltage signal into a current signal, and provide a certain negative phase shift in a certain frequency range. In the case of a same parameter, each cascode transistor in the circuit, aided by a characteristic that a parasitic parameter value thereof is changed with a change of an operating frequency, may obtain a desired phase shift by changing a size of each cascode transistor at the same time, so that the oscillation signal and the injection signal turn over a certain angle at the same time, and φ=45° required by the quadrature signal is met, thus enabling the oscillator to operate at a position of the mode 1 (such as the frequency $\omega_1$ in FIG. 3), while the mode 2 cannot operate due to a smaller impedance at a corresponding position (such as the frequency $\omega_2$ in FIG. 3).

Meanwhile, since the oscillator oscillates at a highest impedance position in a center according to the present invention, when the voltage-controlled current source circuit changes the magnitude of the control voltage, a superimposed signal of the oscillation signal and the injection signal may keep a higher impedance at a position which deviates from a middle position in a wide range, which means that oscillation may be kept in the wide range. However, when a traditional oscillator is located at a position of the mode 1 or the mode 2, when the voltage-controlled current source circuit changes the magnitude of the control voltage, the oscillator may be unable to operate due to entering a smaller impedance state.

Compared with the traditional circuit, the cascode structure also has a larger output impedance, which may prevent the parasitic parameter of the transistor from affecting the resonant circuit and enable the circuit to oscillate more easily. In this way, the cascode structure is used as the phase shift circuit, which plays a role of oscillation and injection, and more importantly, is able to simplify the circuit greatly and generate a phase shift meeting phase deflection in a lower frequency band compared with the prior art. A quality factor of the oscillator will be greatly affected by using a varactor in the resonant circuit in the oscillator with an operating frequency greater than 10 GHz through simulation verification, but the phase shift may be kept at about 45° in the frequency band greater than 10 GHz by adjusting a width-length ratio of a common-gate transistor in the cascode structure, and the quality factor of the resonant circuit cannot be attenuated due to introduction of a variable capacitance.

Figure 4:
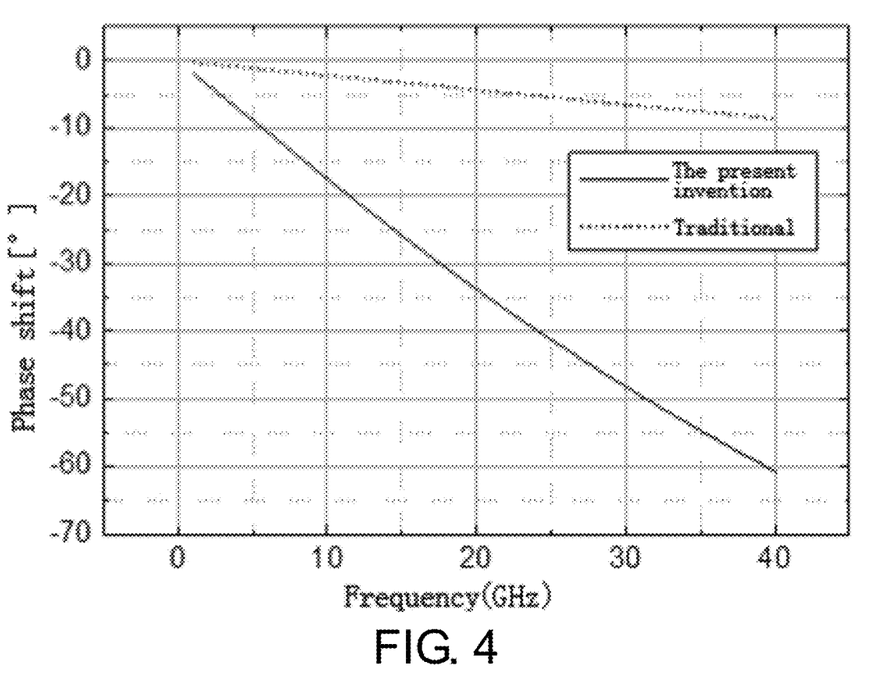
FIG. 4 is a comparison diagram of phase shift performances of a phase shift circuit of the present invention and a traditional phase shift circuit.

FIG. 4 is a comparison diagram of phase shift performances of a phase shift circuit of the present invention and a traditional phase shift circuit. A phase shift curve between an output current and an input voltage of the transistor of the traditional oscillating circuit is compared with a phase shift curve between an output current and an input voltage of the transistor in the present invention. The cascode structure obtains a phase shift several times larger than that of the traditional cascode structure through an internal parasitic parameter thereof and corresponding voltage-current conversion.

Embodiment 1

A quadrature voltage-controlled oscillator with phase shift in a frequency band of 28 GHz is designed and manufactured by a TSMC 65 nm CMOS technology.

Figure 5:
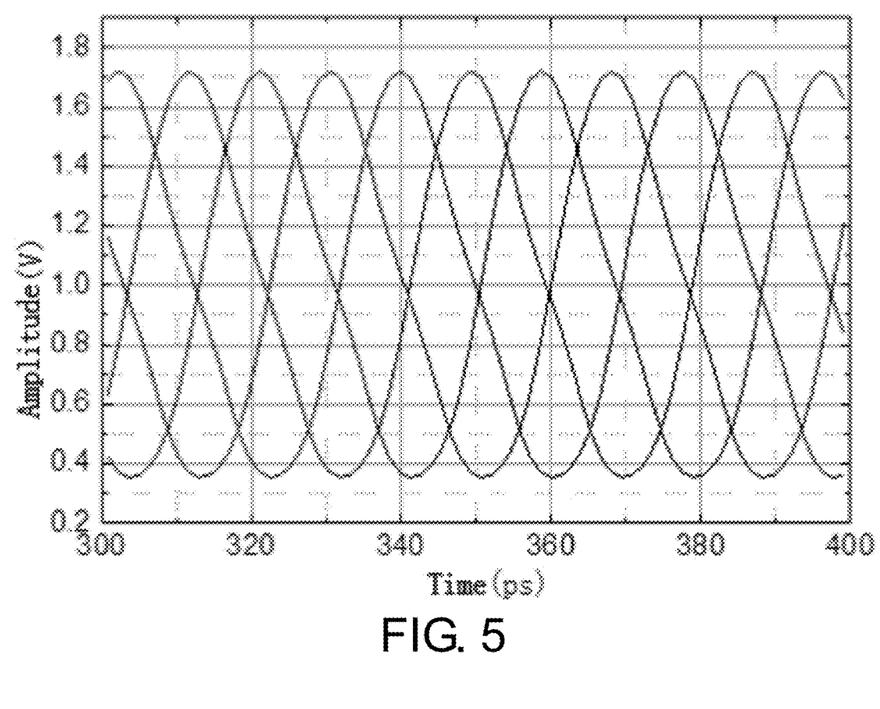
FIG. 5 is a diagram of a time domain waveform of an output end of the present invention.

FIG. 5 is a diagram of a time domain waveform of an output end of the present invention, which shows a waveform of each output end in an analog time domain of the present invention. Voltages of four output ports thereof are in quadrature, which means that a phase difference between every two voltages is 90°.

Figure 6:
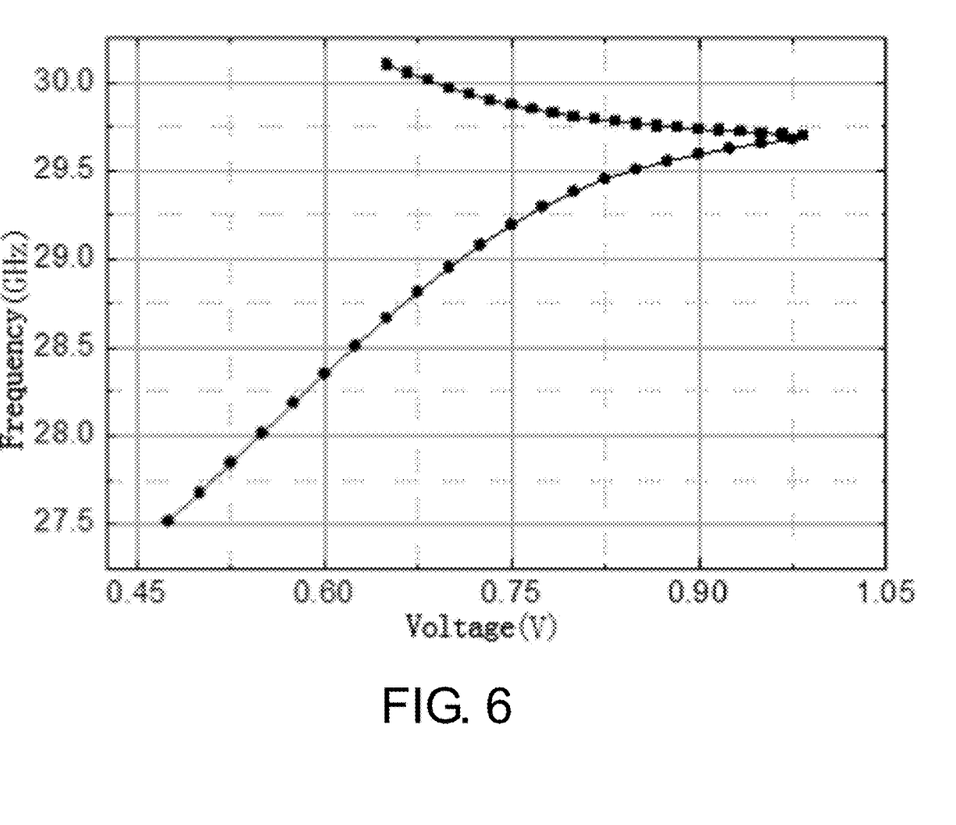
FIG. 6 is a diagram of a frequency adjustment range of a traditional circuit.
Figure 7:
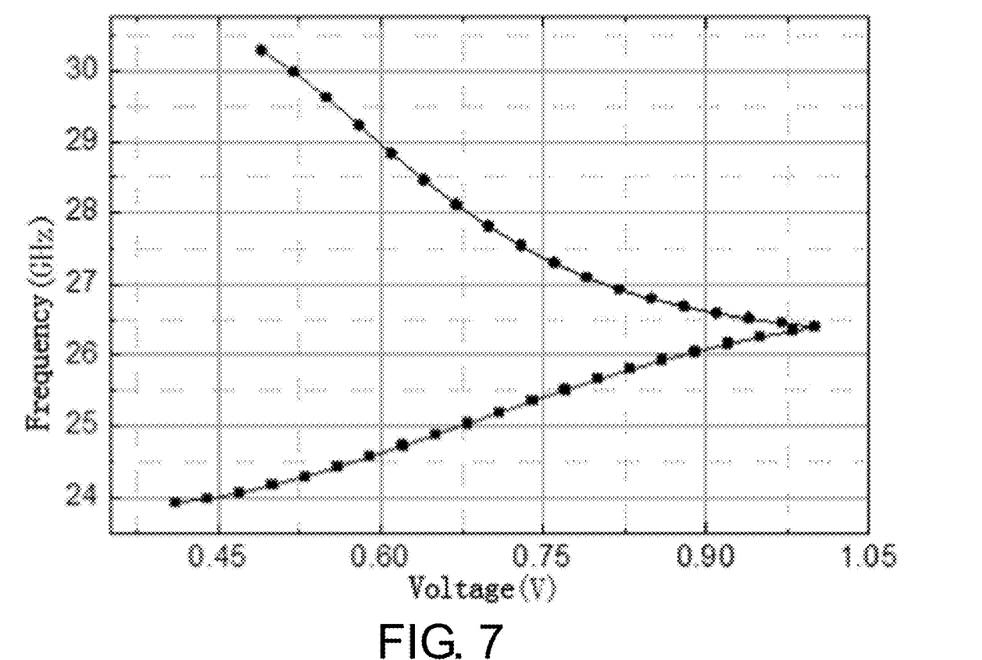
FIG. 7 is a diagram of a frequency adjustment range of a circuit of the present invention.

FIG. 6 and FIG. 7 show frequency adjustment ranges of a traditional circuit under different bias voltages and frequency adjustment ranges of a circuit of the present invention under different bias voltages. In FIG. 6 and FIG. 7, an upper line segment indicates that a frequency tuning range of a voltage $V_1$ is changed when $V_2=1$ V, and a lower line segment indicates that a frequency tuning range of a voltage $V_2$ is changed when $V_1=1$ V. According to the present invention, an initial phase shift is increased, so that the frequency adjustment range is expanded from an original range of 27.5 GHz to 30 GHz to a range of 24 GHz to 30.5 GHz, and a relative bandwidth is increased from 9% to 23%.

Figure 8:
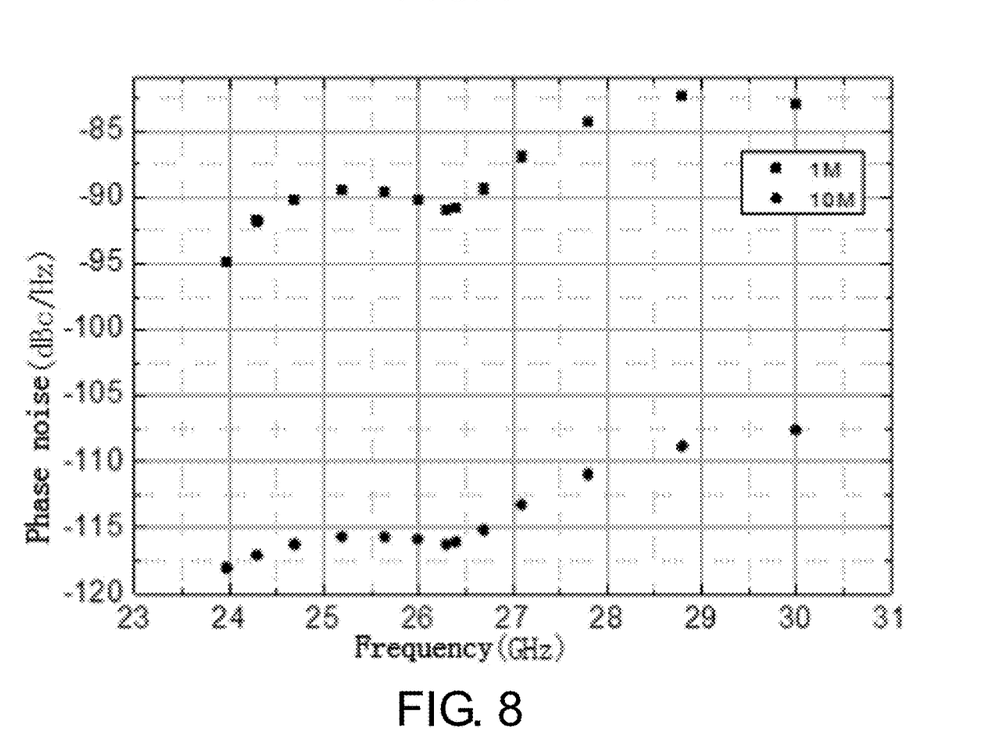
FIG. 8 is a diagram of phase noise of the present invention when a frequency shift is 1 M and 10 M.

Phase noise in the present invention at a shift frequency Δf can be obtained by using the following formula:

$$\mathcal{L}(\Delta f) = 10\lg\left(\frac{F}{Q_T V_0^2} \cdot \frac{kT}{C} \cdot \frac{f_0}{\Delta f^2}\right)$$

wherein F is a noise coefficient, $Q_T$ is a loop quality factor, $V_0$ is an output voltage amplitude, k is a Boltzmann constant, T is an absolute temperature, C is a loop capacitance, and $f_0$ is a central oscillation frequency.

FIG. 8 shows a change of analog phase noise of the manufactured quadrature voltage-controlled oscillator with the phase shift along with a change of a frequency.

To sum up, according to the quadrature voltage-controlled oscillator circuit with the phase shift of the present invention, the oscillator is enabled to operate stably in one mode by means of a simple circuit structure, and a good phase shift can be provided for the resonant circuit in a lower frequency band. Meanwhile, the tuning range of the oscillator is improved without increasing the phase noise.

What is claimed is:

1. A quadrature voltage-controlled oscillator circuit with phase shift, comprising a first voltage-controlled oscillator and a second voltage-controlled oscillator with a same structure, the first voltage-controlled oscillator and the second voltage-controlled oscillator being connected to each other through input and output ports, wherein the first voltage-controlled oscillator comprises a first cross-coupled oscillating circuit, a first injection locking circuit, a first resonant circuit and a first voltage-controlled current source circuit which are electrically connected to each other, wherein, the first cross-coupled oscillating circuit is composed of four transistors, wherein a gate of a first transistor and a gate of a third transistor are jointly connected to a bias voltage, a drain of the first transistor is connected to a gate of a fourth transistor through a first node, a drain of the third transistor is connected to a gate of a second transistor through a second node, and a source of the second transistor is connected to a source of the fourth transistor through a third node, wherein the first injection locking circuit is composed of four transistors, a gate of a fifth transistor and a gate of a seventh transistor are jointly connected to the bias voltage, a drain of the fifth transistor is connected to the first node, a drain of the seventh transistor is connected to the second node, a source of a sixth transistor is connected to a source of an eighth transistor through a fourth node, a gate of the sixth transistor is connected to a positive quadrature input port, and a gate of the eighth transistor is connected to a negative quadrature input port.

2. The quadrature voltage-controlled oscillator circuit with the phase shift according to claim 1, wherein the first resonant circuit further comprises a first center tap inductor, two ends of the first center tap inductor are respectively connected to the first node and the second node, and a center tap is connected to a supply voltage.

3. The quadrature voltage-controlled oscillator circuit with the phase shift according to claim 1, wherein the first voltage-controlled current source circuit comprises a first cross-coupled current source and a first injection locking current source, wherein a drain of a ninth transistor is connected to the third node, a source of the ninth transistor is grounded, and a gate of the ninth transistor is connected to a first control voltage to form the first cross-coupled current source; and a drain of a tenth transistor is connected to the fourth node, a source of the tenth transistor is grounded, and a gate of the tenth transistor is connected to a second control voltage to form the first injection locking current source.

4. The quadrature voltage-controlled oscillator circuit with the phase shift according to claim 1, wherein the second voltage-controlled oscillator comprises a second cross-coupled oscillating circuit, a second injection locking circuit, a second resonant circuit and a second voltage-controlled current source circuit which are electrically connected to each other, and has a structure same as the first voltage-controlled oscillator, and in the second injection locking circuit, a gate of a sixteenth transistor is connected to a positive in-phase input port, and a gate of an eighteenth transistor is connected to a negative in-phase input port.

5. The quadrature voltage-controlled oscillator circuit with the phase shift according to claim 1, wherein the first node of the first voltage-controlled oscillator is connected to a negative in-phase output port, and the first negative in-phase output port is connected to a negative in-phase input port of the second voltage-controlled oscillator; the second node of the first voltage-controlled oscillator is connected to a positive in-phase output port, and the first positive in-phase output port is connected to a positive in-phase input port of the second voltage-controlled oscillator; a fifth node of the second voltage-controlled oscillator is connected to a positive quadrature output port, and the second positive quadrature output port is connected to a positive quadrature input port of the first voltage-controlled oscillator; and a sixth node of the second voltage-controlled oscillator is connected to a negative quadrature output port, and the negative quadrature output port is connected to a negative quadrature input port of the first voltage-controlled oscillator.

\* \* \* \* \*